(12) United States Patent
Naiini et al.

(10) Patent No.: US 6,939,659 B2
(45) Date of Patent: Sep. 6, 2005

(54) PHOTOSENSITIVE RESIN COMPOSITIONS

(75) Inventors: Ahmad A. Naiini, East Greenwich, RI (US); William D. Weber, Rumford, RI (US); Pamela D. Waterson, Northbridge, MA (US); Steve Lien-Chung Hsu, Taiwan (TW)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/793,337

(22) Filed: Mar. 4, 2004

(65) Prior Publication Data

US 2004/0229167 A1 Nov. 18, 2004

Related U.S. Application Data

(60) Provisional application No. 60/453,870, filed on Mar. 11, 2003, and provisional application No. 60/491,210, filed on Jul. 30, 2003.

(51) Int. Cl.[7] .......................... G03F 7/023; G03F 7/30
(52) U.S. Cl. .................. 430/190; 430/18; 430/191; 430/192; 430/193; 430/326; 430/330
(58) Field of Search .................. 430/18, 190, 191, 430/192, 193, 326, 330

(56) References Cited

U.S. PATENT DOCUMENTS

| | | | |
|---|---|---|---|
| 4,339,521 A | 7/1982 | Ahne et al. | 430/192 |
| 4,371,685 A | 2/1983 | Ahne et al. | 528/73 |
| 4,395,482 A | 7/1983 | Ahne et al. | 430/326 |
| 4,622,285 A | 11/1986 | Ahne et al. | 430/322 |
| 4,849,051 A | 7/1989 | Ahne et al. | 216/48 |
| 5,021,320 A | 6/1991 | Mueller et al. | 430/192 |
| 5,037,720 A | 8/1991 | Khanna | 430/190 |
| 5,077,378 A | 12/1991 | Mueller et al. | 528/185 |
| 5,081,000 A | 1/1992 | Kuehn et al. | 430/281.1 |
| 5,096,999 A | 3/1992 | Hellmut et al. | 528/182 |
| 5,240,819 A | 8/1993 | Mueller et al. | 430/326 |
| 5,449,584 A | 9/1995 | Banba et al. | 430/190 |
| 5,783,654 A | 7/1998 | Sezi et al. | 528/310 |
| 5,922,825 A | 7/1999 | Sezi et al. | 528/191 |
| 5,973,202 A | 10/1999 | Sezi et al. | 564/134 |
| 6,071,666 A | 6/2000 | Hirano et al. | 430/191 |
| 6,120,970 A | 9/2000 | Sezi et al. | 430/192 |
| 6,127,086 A * | 10/2000 | Waterson et al. | 430/190 |
| 6,143,467 A * | 11/2000 | Hsu et al. | 430/270.1 |
| 6,153,350 A | 11/2000 | Sezi et al. | 430/192 |
| 6,177,225 B1 * | 1/2001 | Weber et al. | 430/190 |
| 6,207,356 B1 | 3/2001 | Banba et al. | 430/326 |
| 6,235,436 B1 | 5/2001 | Hirano et al. | 430/18 |
| 2004/0229160 A1 * | 11/2004 | Naiini et al. | 430/270.1 |

FOREIGN PATENT DOCUMENTS

JP 11-109635 4/1999

OTHER PUBLICATIONS

Jan Rabek, Experimental Methods in Polymer Chemistry, John Wiley & Sons, New York, 1983. (This reference is a book).

* cited by examiner

*Primary Examiner*—John S. Chu
(74) *Attorney, Agent, or Firm*—Ohlandt, Greeley, Ruggiero & Perle, LLP

(57) ABSTRACT

A positive photosensitive resin composition of at least one uncapped polybenzoxazole precursor polymer, at least one capped polybenzoxazole precursor polymer, at least one photosensitive agent and at least one solvent, use of such compositions to pattern an image on a substrate and the resulting relied patterned substrates and electronic parts therefrom.

40 Claims, 1 Drawing Sheet

PHOTOSENSITIVE RESIN COMPOSITIONS

RELATED APPLICATION

This application claims priority from U.S. Provisional Application Nos. 60/453,870 filed Mar. 11, 2003 and 60/491,210 filed Jul. 30, 2003.

FIELD OF THE INVENTION

The present invention relates to positive photosensitive resin compositions. More specifically, the present invention relates to positive-working, aqueous base developable photosensitive polybenzoxazole (PBO) precursor compositions that are suitable for applications in the field of microelectronics, a process of use for said photosensitive composition, and electronic parts produced by said process of use.

BACKGROUND OF THE INVENTION

In microelectronic applications, polymers that demonstrate high temperature resistance are generally well known. Precursors of such polymers, such as polyimides and polybenzoxazoles can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Conventional positive-working photosensitive polybenzoxazoles (PBO) contain an alkaline soluble PBO precursor and a diazoquinone photoactive compound as shown in U.S. Pat. No. 4,371,685. The diazoquinone compound inhibits the solubility of the PBO precursor in an aqueous base. After exposure to light, the diazoquinone compound undergoes photolysis and converts to indenecarboxylic acid, which promotes the aqueous base solubility of the PBO precursor.

Applications for photosensitive polybenzoxazole precursor resin compositions typically require film thicknesses in excess of 5 microns. As a result, the absorbance by the photosensitive composition are typically very high, which results in higher exposure requirements (resulting in slower throughput in manufacturing) and a degradation of image acuity. The photoactive agents are one of the primary species raising the absorbance of the photosensitive polybenzoxazole precursor resin compositions. Lowering the absorbance by decreasing the amount of photoactive agents, typically results in lowering the image acuity and increasing the amount of unexposed film thickness loss. We have surprisingly found that positive photosensitive formulations prepared according to the present invention compared to the prior art decrease the optical absorbance of films prepared from the formulations without substantially affecting the unexposed film dissolution. Consequently, the positive photosensitive formulations prepared according to the present invention have improved photospeed when exposed in i-line and g-line radiation while maintaining high contrast.

SUMMARY OF THE INVENTION

The present invention provides a positive photosensitive resin composition comprising:

(a) at least one polybenzoxazole precursor polymer having the Structure (I);

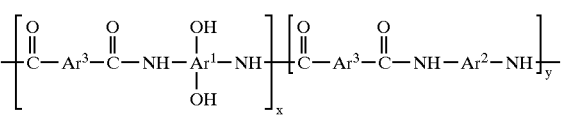

(I)

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon, or mixtures thereof; $Ar^3$ is a divalent aromatic group or a divalent aliphatic group, a divalent heterocyclic group, or mixtures thereof; x is from about 10 to about 1000; y is 0 to about 900;

(b) at least one polybenzoxazole precursor polymer having the structure (II)

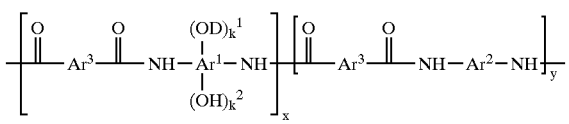

(II)

wherein $Ar^1$, $Ar^2$, $Ar^3$, x and y are as previously defined; D is one of the following moieties:

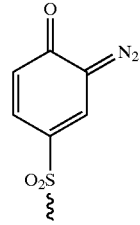

IIIa

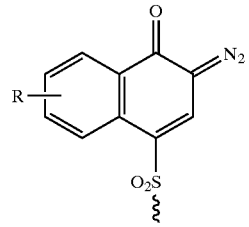

IIIb

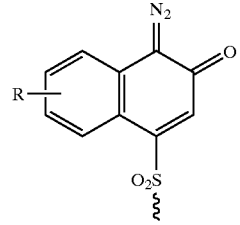

IIIc

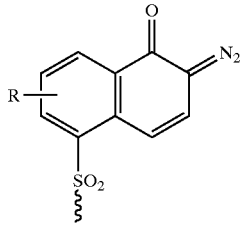

IIId

-continued

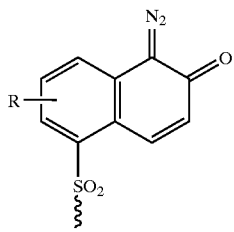
IIIe

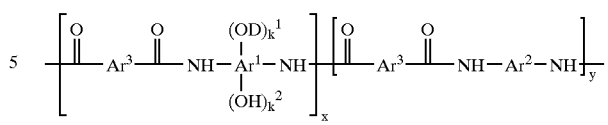
(II)

wherein $Ar^1$, $Ar^2$, $Ar^3$, x and y are as previously defined; D is one of the following moieties IIIa–e:

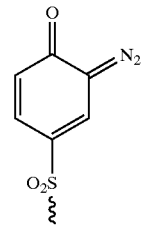
IIIa

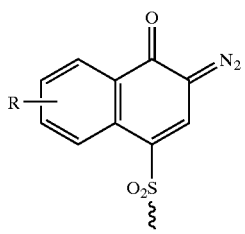
IIIb

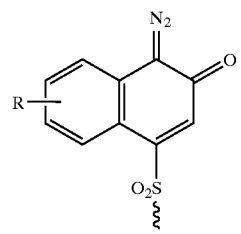
IIIc

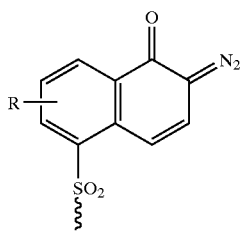
IIId

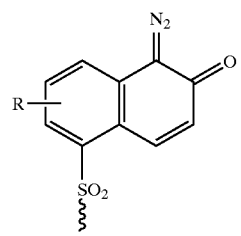
IIIe wherein R is H, a halogen, a $C_1$–$C_4$ alkyl group, a $C_1$–$C_4$ alkoxy group, or a $C_5$–$C_7$ cycloalkyl group; $k^1$ can be any positive value of up to about 0.5, $k^2$ can be any value from about 1.5 to 2 with the proviso that $(k^1+k^2)=2$,
(c) at least one photosensitive agent; and
(d) at least one solvent.

The present invention also provides a process for forming a relief pattern and electronic parts using the photosensitive composition and, the resulting relief patterns and electronic parts. The process comprises the steps of:

(a) coating on a suitable substrate, a positive-working photosensitive composition comprising at least one polybenzoxazole precursor polymer having the structure (I), at least one polybenzoxazole precursor polymer having the structure (II), at least one photosensitive agent and at least one solvent, thereby forming a coated substrate;
(b) prebaking the coated substrate;
(c) exposing the prebaked coated substrate to actinic radiation;
(d) developing the exposed coated substrate with an aqueous developer, thereby forming an uncured relief image on the coated substrate; and
(e) baking the developed coated substrate at an elevated temperature, thereby curing the relief image.

BRIEF DESCRIPTION OF THE DRAWING

The drawing FIGURE present contrast curves for compositions of this invention and comparative compositions.

DETAILED DESCRIPTION OF THE INVENTION

Figure 1:
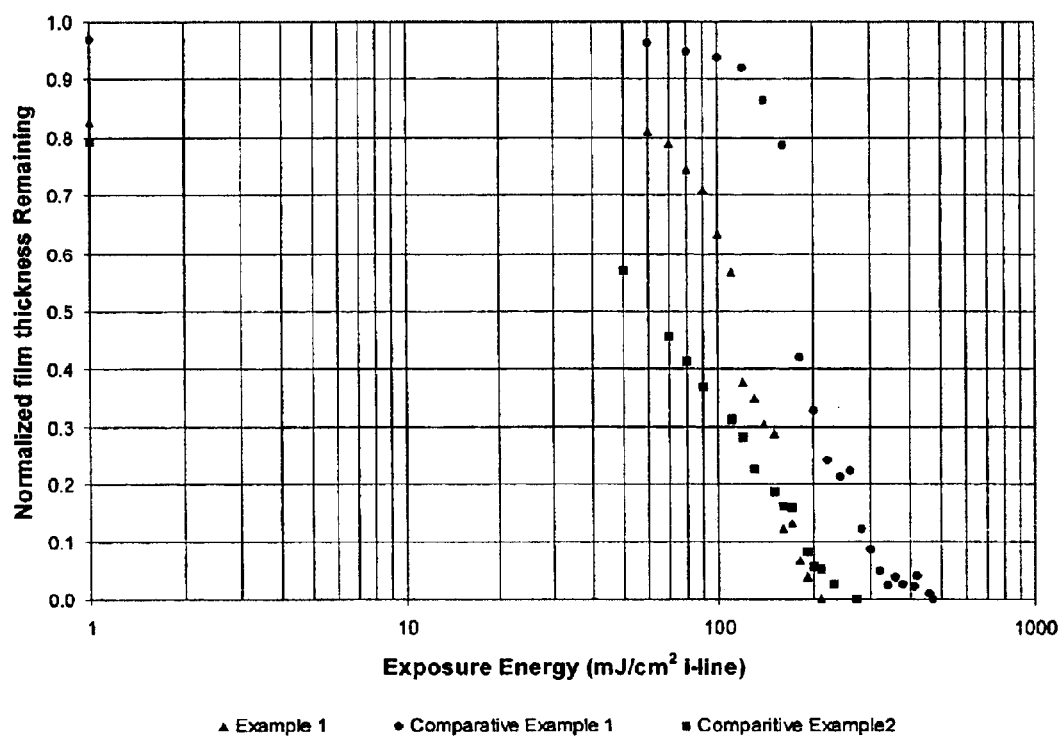

The present invention provides a positive photosensitive resin composition comprising:
(a) at least one polybenzoxazole precursor polymer having the Structure (I);

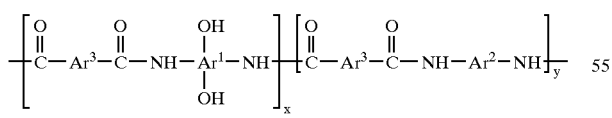
(I)

wherein $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group or a divalent aliphatic group, a divalent heterocyclic group, or mixtures thereof; x is from about 10 to about 1000; y is 0 to about 900;
(b) at least one polybenzoxazole precursor polymer having the structure (II)

wherein R is H, a halogen, a $C_1$–$C_4$ alkyl group, a $C_1$–$C_4$ alkoxy group, or a $C_5$–$C_7$ cycloalkyl group; $k^1$ can be any positive value of up to about 0.5, $k^2$ can be any value from about 1.5 to 2 with the proviso that $(k^1+k^2)=2$ and $k^1$ is not 0,
(c) at least one photosensitive agent; and
(d) at least one solvent.

The polybenzoxazole precursor polymers of Structure I may be synthesized by reaction of monomers having structures (IV), (V), and (VI) in the presence of a base.

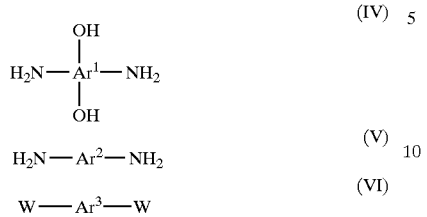

(IV)

(V)

(VI)

wherein $Ar^1$, $Ar^2$, $Ar^3$, x, and y are as previously defined, and W is C(O)Cl, COOH or C(O)$OR^9$, wherein $R^9$ is a $C_1$–$C_4$ alkyl group or a $C_5$–$C_7$ cycloalkyl group.

In Structure (IV), $Ar^1$ is a tetravalent aromatic group, a tetravalent heterocyclic group, or mixtures thereof. Examples of $Ar^1$ include, but are not limited to:

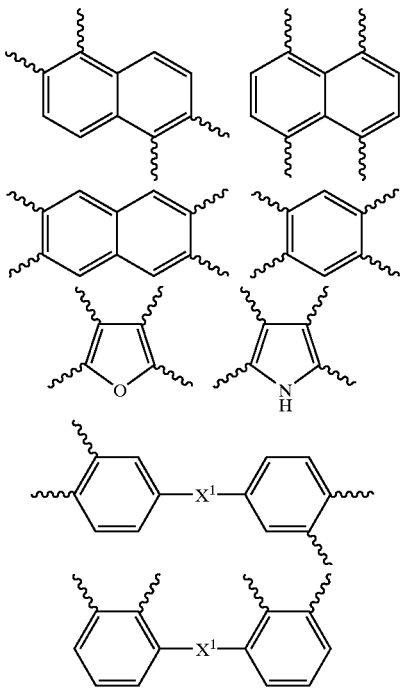

wherein $X^1$ is —O—, —S—, —C(CF$_3$)$_2$—, —CH$_2$—, —SO$_2$—, —NHCO— or —SiR$^1_2$— and each $R^1$ is independently a $C_1$–$C_7$ linear or branched alkyl or $C_5$–$C_8$ cycloalkyl group. Examples of $R^1$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl.

Examples of monomers having the Structure (IV) containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane. The substitution pattern of the two hydroxy and two amino groups in the monomer of Structure IV may be any of the possible substitution patterns with the proviso that the each amino group has an ortho relationship with a hydroxyl group in order to be able to form the benzoxazole ring. Furthermore, the polybenzoxazole precursor polymer of Structure I may be synthesized using a mixture of two or more monomers described by Structure IV.

In Structure (V), $Ar^2$ is a divalent aromatic, a divalent heterocyclic, a divalent alicyclic, or a divalent aliphatic group that may contain silicon. Examples of $Ar^2$ include, but are not limited to:

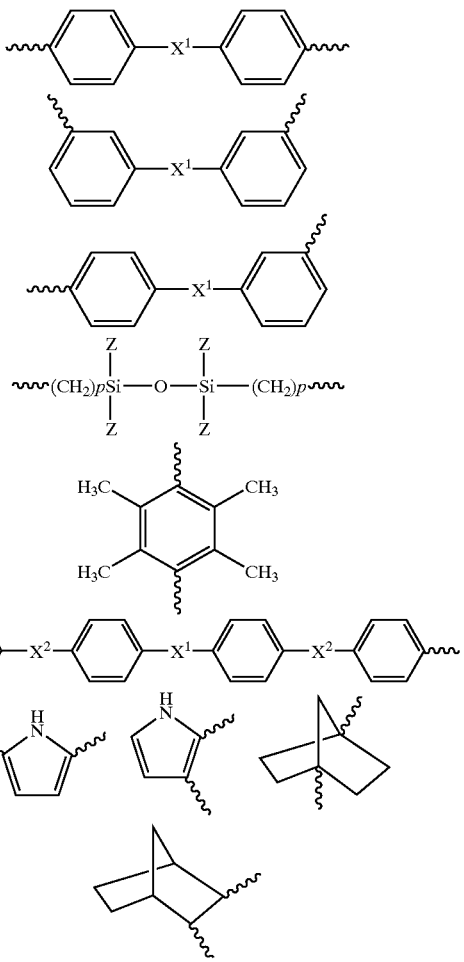

wherein $X^1$ is as defined before, $X^2$ is —O—, —S—, —C(CF$_3$)$_2$—, —CH$_2$—, —SO$_2$—, or —NHCO—, Z=H or a $C_1$–$C_8$ linear, branched or cyclic alkyl group and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl, and cyclooctyl.

Examples of monomers having the Structure (V) containing $Ar^2$ include, but are not limited to, 5(6)-amino-1-(4-aminophenyl)-1,3,3-trimethylindane (DAPI), m-phenylenediamine, p-phenylenediamine, 2,2'-bis(trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy)benzene, 1,3-bis(3-aminophenoxy)benzene, 1,4-bis(γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethylnonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl)methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, and 3,3'sulfonyl-dianiline. Futhermore, the polybenzoxazole precursor polymer of Structure I, may be synthesized using a mixture of two or more monomers described by Structure V.

In Structure (VI), $Ar^3$ is a divalent aromatic group, a divalent aliphatic group, a divalent heterocyclic group, or mixtures thereof. Examples of $Ar^3$ include, but are not limited to:

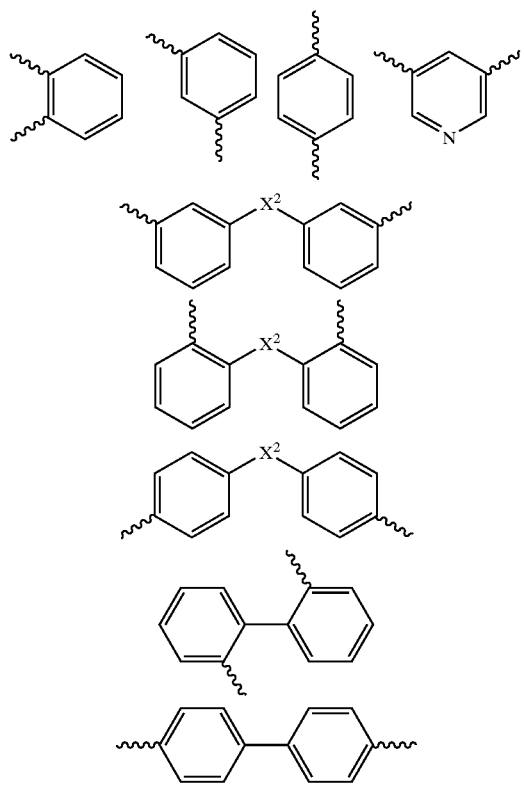

-continued

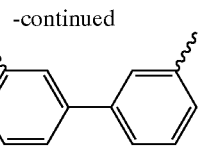

wherein $X^2$ is —O—, —S—, —C(CF$_3$)$_2$—, —CH$_2$—, —SO$_2$—, or —NHCO—.

In Structure (VI), W is C(O)Cl, COOH or C(O)OR$^9$ wherein —R$^9$ is a C$_1$–C$_7$ linear or branched alkyl group or a C$_5$–C$_8$ cycloalkyl group. Examples of R$^9$ include, but are not limited to, —CH$_3$, —C$_2$H$_5$, n-C$_3$H$_7$, i-C$_3$H$_7$, n-C$_4$H$_9$, t-C$_4$H$_9$, and cyclohexyl. Monomers having the Structure VI are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=C(O)Cl) include, but are not limited to, isophthaloyl dichloride, phthaloyl dichloride, terephthaloyl dichloride, 4,4'-diphenyletherdicarboxylic acid dichloride, and mixtures thereof. Examples of suitable dicarboxylic esters (W=CO$_2$R$^9$) include, but are not limited to: dimethylisophthalate, dimethylphthalate, dimethylterphthalate, diethylisophthalate, diethylphthalate, diethylterphthalate and mixtures thereof. A preferred embodiment of the invention is where the monomers employed in the synthesis of polymers of Structure I include a mixture of two or more monomers of Structure VI. The solubility of the polymer in formulation solvent as well as in the aqueous developer can be modified by the particular monomers employed. Mixtures of two monomers of Structure VI are useful to achieve optimum solubility in both the formulation solvent and aqueous based developer.

The polybenzoxazole precursor polymer of Structure (I) can be synthesized by reaction of monomers (IV) and (V) and (VI). Any conventional method for reacting a dicarboxylic acid or its dichloride or diester with at least one aromatic and/or heterocyclic dihydroxydiamine, and optionally, with at least one diamine, may be used. Generally, the reaction for diacid chlorides (W=C(O)Cl) is carried out at about –10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethyl pyridine, and dimethylaniline. The polybenzoxazole precursor polymer of Structure I may be isolated by precipitation into water, recovered by filtration and dried. Descriptions of suitable syntheses employing diesters or diacids may be found in U.S. Pat. Nos. 4,395,482, 4,622,285, and 5,096,999, herein incorporated by reference.

The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure IV, V, and VI are employed such that the ratio of [(IV)+(V]/(VI) is generally from about 0.9 to about 1.1. Preferably, the ratio of [(IV)+(V]/(VI) is generally from about 0.92 to about 1.08. The monomer having the Structure (IV) is employed from about 10 to about 100 mole % of [(IV)+(V)] and the monomer having Structure (V) is employed from about 0 to about 90 mole % of [(IV)+(V)]. Distribution of the polymeric units resulting from monomers having the Structures IV and V in the polybenzoxazole precursor polymer (enclosed in brackets in Structures I and II), may be random or in blocks within it.

In Structures I and II, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5. The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley&Sons, New York, 1983.

Polybenzoxazole precursor polymers of structure (I) can be reacted with about 1–50 mole % of a diazoquinone (DCI) to produce a capped polybenzoxazole precursor polymer of structure (II). Reaction with about 1 to about 40 mole % is preferred.

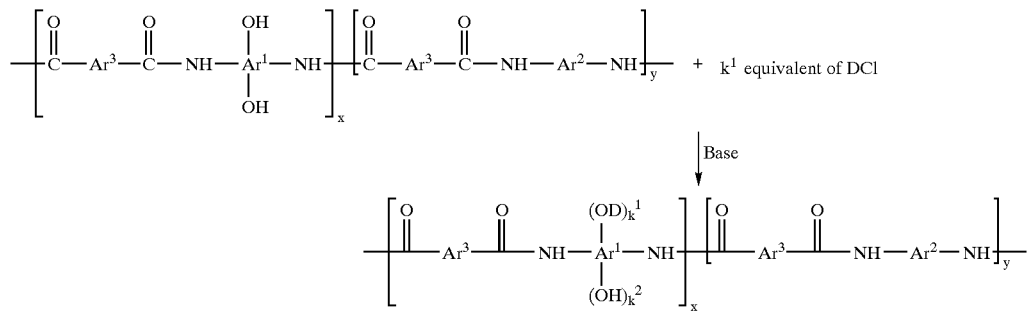

wherein $Ar^1$, $Ar^2$, $Ar^3$, D, $k^1$, $k^2$, x and y are as previously defined.

Examples of the diazoquinone compound DCI that can be reacted with the polybenzoxazole precursor polymer of Structure (I) include, but are not limited to,

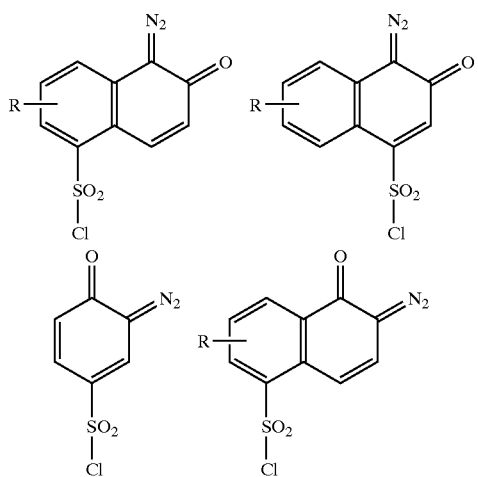

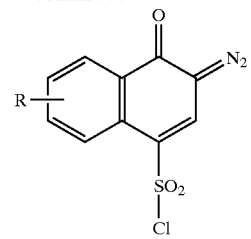

wherein, R is H, a halogen, a $C_1$ to $C_4$ alkyl group, a $C_1$ to $C_4$ alkoxy group, or cyclohexyl. Examples of suitable R groups include, but are not limited to, chloro, methyl, ethyl, isopropyl, n-propyl, n-butyl, iso-butyl, sec-butyl, methoxy, ethoxy, n-propoxy, iso-propoxy, n-butoxy, cyclopentyl or cyclohexyl.

Generally, the reaction is carried out at about 0° C. to about 30° C. for about 3 to about 24 hours in a solvent in the presence of a base. Generally, a slight excess of base to DCI is employed. Examples of bases include but are not limited to amine bases such as pyridine, trialkylamine, methylpyridine, lutidine, n-methylmorpholine, and the like. The most preferred base is triethylamine. The preferred reaction solvents are N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL). The reaction mixture should be protected from actinic rays.

The molar amount of DCI may range from about 1% to about 50% of the quantity of OH groups from monomers of Structure IV to yield $k^1$ from about 0.01 to about 0.5. A preferred amount of DCI is from about 1% to about 40% of the quantity of OH groups from monomers of Structure IV to yield $k^1$ from about 0.01 to about 0.4. A more preferred amount of DCI is from about 1% to about 10% of the quantity of OH groups from monomers of Structure IV to yield $k^1$ from about 0.01 to about 0.1. A most preferred amount of DCI is from about 1% to about 5% of the quantity of OH groups from monomers of Structure IV to yield $k^1$ from about 0.01 to about 0.05.

The preferred D for the polybenzoxazole precursor polymer of Structure II are IIIb and IIId and the most preferred D for the polybenzoxazole precursor polymer of Structure II is IIId IIIb

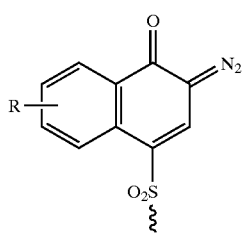

IIId

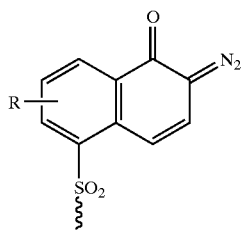

wherein R is H, a halogen, a $C_1$–$C_4$ alkyl group, a $C_1$–$C_4$ alkoxy group, or a $C_5$–$C_7$ cycloalkyl group. Examples of suitable R groups include but are not limited to chloro, methyl, ethyl, isopropyl, n-propyl, n-butyl, iso-butyl, sec-butyl, methoxy, ethoxy, n-propoxy, iso-propoxy, n-butoxy, cyclopentyl or cyclohexyl.

The photosensitive agent comprises one or more compounds which react upon exposure to increase the dissolution rate of the exposed area over the unexposed areas of the photosensitive composition. Examples of suitable photosensitive agents include those nonpolymeric compounds (VII) containing one or more diazoquinone moieties D (as described before or a dihydropyridine compound (VIII) (vide infra).

Compounds having diazoquinone moieties D are typically diazoquionone esters of phenolic compounds or amides of aromatic amines. Examples of suitable diazoquinone compounds VII include, but are not limited to, the following structures:

VII-a

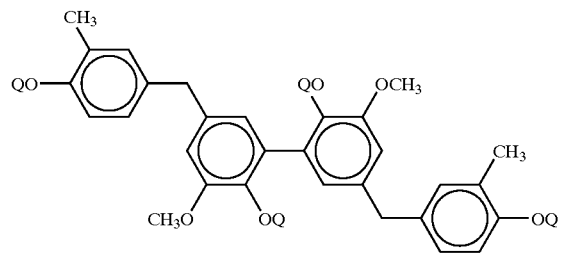

VII-b

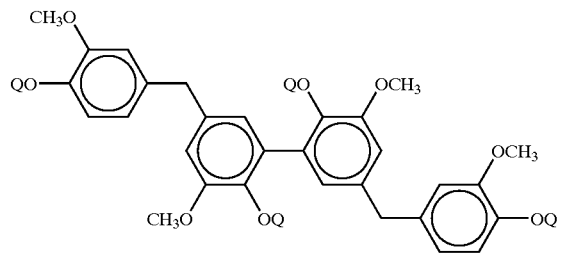

VII-c

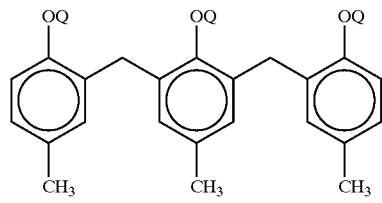

VII-d

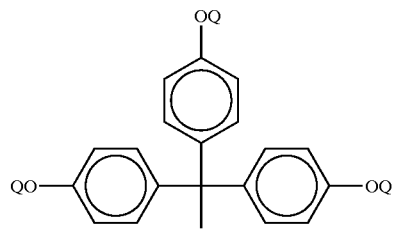

VII-e

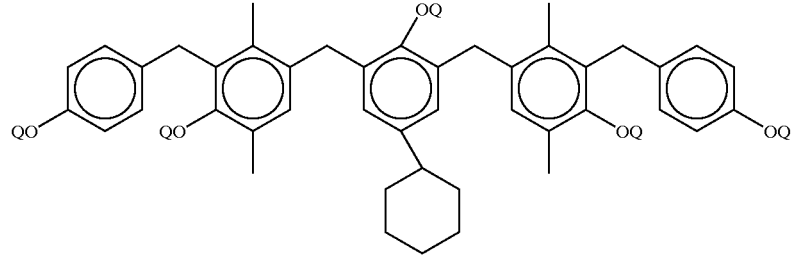

-continued
VII-f
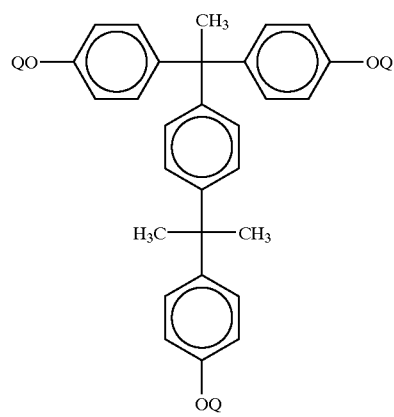
VII-g
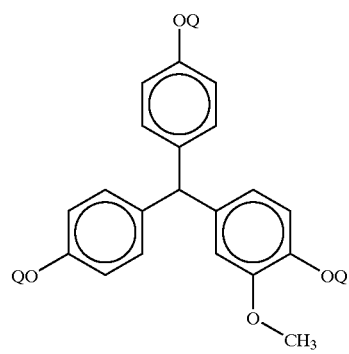
VII-h
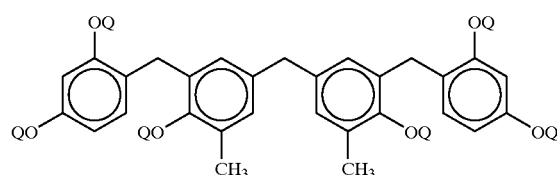
VII-i
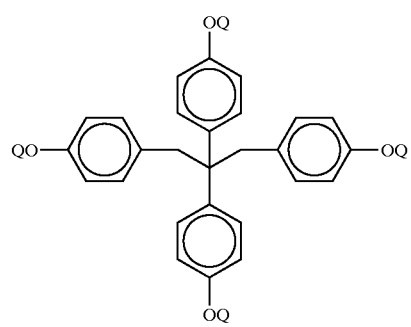
VII-j
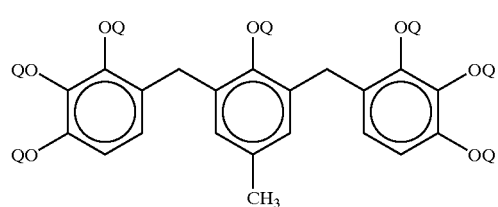
VII-k
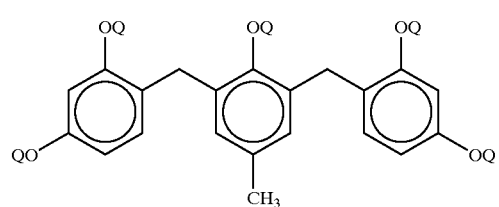
VII-l
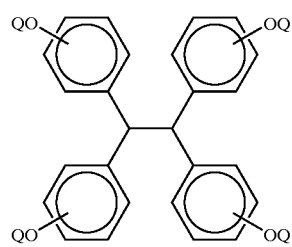
VII-m
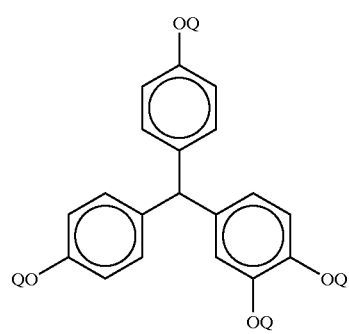

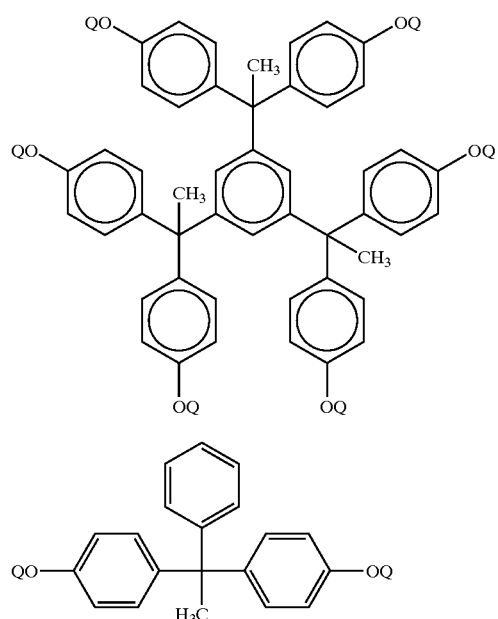

VII-n

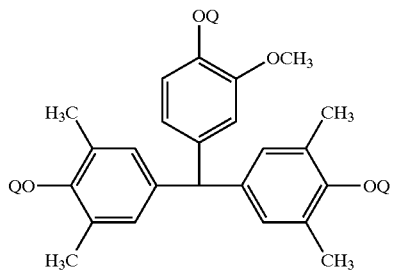

VII-o

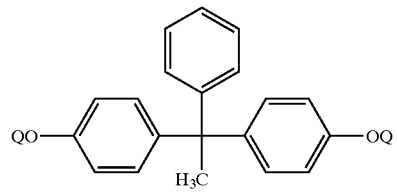

VII-p wherein Q is H or D as defined previously with the proviso that in each compound at least one Q is not H. The preferred D for the photoactive agents VII are IIIb and IIId. The most preferred D for the photoactive agent is IIId.

Preferred diazoquinone photosensitive agents are VII-e, VII-g, VII-i, VII-j, VII-m, and VII-o where Q=H or IIIb or IIId. More preferred diazoquinone photosensitive agents are VII-e, VII-g, VII-i, VII-j, VII-m, and VII-o where Q=H or IIId. Most preferred diazoquinone photosensitive agents are VII-e, VII-j, VII-m, and VII-o where Q=H or IIId.

Suitable dihydropyridine compounds (VII) can be, for example, described by the following structure:

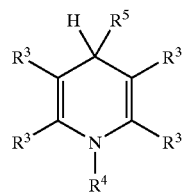

VIII wherein $R^3$ groups may be the same or different and may be H, OH, COO—$(CH_2)_n$—$CH_3$, $(CH_2)_n$—$CH_3$, O—$(CH_2)_n$—$CH_3$, CO—$(CH_2)_n$—$CH_3$, $(CF_2)_n$—$CF_3$, $C_6H_5$, COOH, $(CH_2)_n$—O—$(CH_2)_m$—$CH_3$, $(CH_2)_n$—OH, $CH_2$=CH—$(CH_2)_p$—CO—$CH_2$, F, Cl, Br or I; m=0 to 10, n=0 to 10, and p=0 to 4; $R^4$ is H, a $C_1$–$C_7$ linear or branched alkyl group, a $C_5$–$C_8$ cycloalkyl group, a mono substituted or unsubstituted phenyl group. Examples of $R^4$ include, but are not limited to, methyl, ethyl, isopropyl, n-propyl, n-butyl, isobutyl, sec-butyl, cyclopentyl, cyclohexyl, phenyl, 4-methylphenyl, 4-methoxyphenyl, and 3-chlorophenyl; $R^5$ is

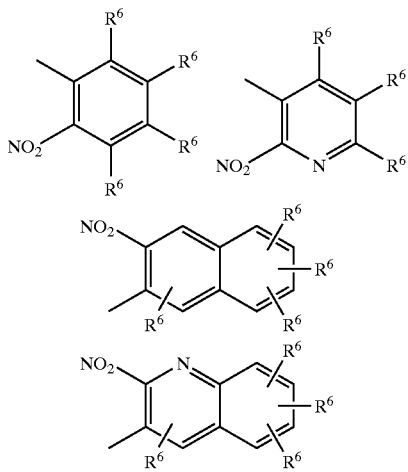

wherein $R^6$ is defined the same as $R^3$ and the $NO_2$ group is in the ortho position with respect to the dihydropyridine ring.

For example, the dihydropyridine may be:

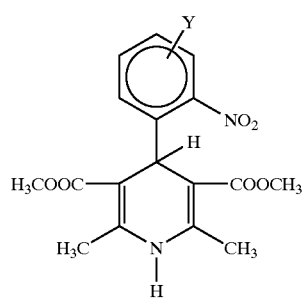

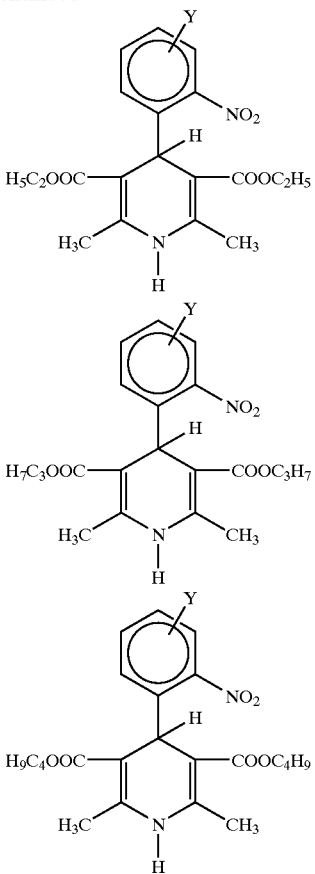

wherein Y is CN, Cl, Br, I, or —OR$^7$ where R$^7$ is a substituted or unsubstituted C$_6$ to C$_{16}$ aromatic group, a substituted or unsubstituted linear or branched C$_1$–C$_{10}$ alkyl group or a C$_5$–C$_{10}$ cyclic alkyl group. Examples of suitable R$^7$ groups include, but are not limited to, methyl, ethyl, cyclohexyl, phenyl, naphthyl, or phenanthryl. Specific examples of suitable dihydropyridine compounds include, but are not limited to,

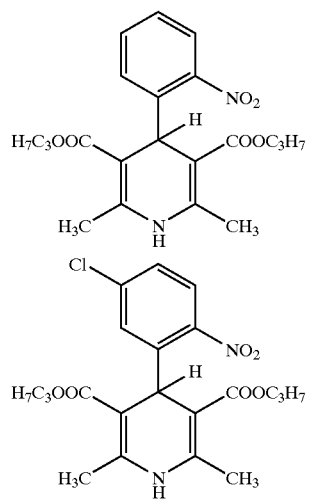

The positive acting, photosensitive composition of this invention comprises at least one polybenzoxazole precursor polymer of Structure I, at least one polybenzoxazole precursor polymer of Structure II, at least one photosensitive agent, and at least one solvent. Suitable solvents are polar organic solvents. Suitable examples of polar organic solvents include but are not limited to, N-methylpyrrolidone (NMP), gamma-butyrolactone (GBL), N,N-dimethylacetamide (DMAc), dimethyl-2-piperidone, N,N-dimethylformamide (DMF), and mixtures thereof. The preferred solvents are gamma-butyrolactone and N-methylpyrrolidone. The most preferred solvent is gamma-butyrolactone.

The amount of polybenzoxazole precursor polymer of Structure I in the photosensitive composition is from about 2.5 wt. % to about 35 wt. % based on the total weight of the composition. A preferred amount of polybenzoxazole precursor polymer (I) is from about 10 wt. % to about 30 wt. % and a more preferred amount is from about 15 wt. % to about 25 wt. %.

The amount of capped polybenzoxazole precursor polymer of Structure II in the photosensitive composition is from about 2.5 wt. % to about 35 wt. % based on the total weight of the composition. A preferred amount of polybenzoxazole precursor polymer (I) is from about 10 wt. % to about 30 wt. % and a more preferred amount is from about 15 wt. % to about 25 wt. %.

The ratio of polymer of Structure I to polymer of Structure II is generally from about 1:87.5 to about 87.5:1. A preferred ratio of polymer of Structure I to polymer of Structure II is from about 20:80 to about 80:20. A more preferred ratio of polymer of Structure I to polymer of Structure II is from about 25:75 to about 75:25. A most preferred ratio of polymer of Structure I to polymer of Structure II is from about 35:65 to about 65:35.

In another embodiment up to 25% of the amount of the polybenzoxazole precursor polymer of Structures I or II may be replaced by other organic solvent soluble, aqueous base soluble, aromatic or heterocyclic group polymers or copolymers. Examples of organic solvent soluble, aqueous base soluble, aromatic or heterocyclic group polymers or copolymers may include polyimides, polybenzoimidazoles, polybenzothiazoles, polytrizoles, polyquinazolones, polyquinazolindiones, polyquinacridones, polybenxazinones, polyanthrazolines, polyoxadiazoles, polyhydantoins, polyindophenazines, or polythiadiazoles.

The amount of diazoquinone compound (VII) used in this composition, if employed, is from about 1 wt. % to about 20 wt. % of the total weight of the composition, preferably, about 2 wt. % to 10 wt. %, and most preferably, about 3 wt. % to about 5 wt. %. The amount employed is affected by the amount of the polymer of Structure II employed. The more polymer of Structure II that is employed in the formulation, generally the lower the amount of diazoquinone compound (VII) employed to maintain adequate photospeed and to prevent image degradation due to high absorbance.

The amount of dihydropyridine compound (VIII) used in this composition, if employed, is from about 1 wt. % to about 20 wt. % of the total weight of the composition. A preferred concentration is from about 2 wt. % to about 10 wt. %, and a most preferred concentration is from about 3 wt. % to about 5 wt. %. If both a diazoquinone compound and a dihydropyridine compound are used, the combined amount of the two in this composition is from about 1 wt. % to about 20 wt. % of the total weight of the composition. A preferred range is, from about 2 wt. % to about 10 wt. %, and a most preferred range is from about 3 wt. % to about 5 wt. %. The ratio of the diazoquinone compound to dihydropyridine compound may range from about 5:95 to about 95:5.

Solvent comprises about 40 wt. % to about 80 wt. % of the photosensitive composition. A preferred solvent range is from about 45 wt. % to about 70 wt. %. A more preferred range of solvent is from about 50 wt. % to about 65 wt. %.

Optionally, an adhesion promoter may be included in the photosensitive composition. Suitable adhesion promoters include, for example, amino silanes, and mixtures or derivatives thereof. If employed, the amount of adhesion promoter ranges from about 0.1 wt. % to about 2 wt. %. A preferred amount of adhesion promoter is from about 0.2 wt. % to about 1.5 wt. %. A more preferred amount of adhesion promoter is from about 0.3 wt. % to about 1 wt. %. Suitable adhesion promoters include, for example, amino silanes, and mixtures or derivatives thereof. Examples of suitable adhesion promoters which may be employed in the invention may be described by Structure IX

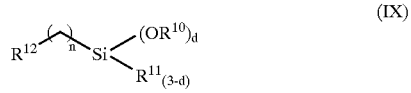

wherein each $R^{10}$ is independently a $C_1$–$C_4$ alkyl group or a $C_5$–$C_7$ cycloalkyl group and each $R^{11}$ is independently a $C_1$–$C_4$ alkyl group, a $C_1$–$C_4$ alkoxy group, or a $C_5$–$C_7$ cycloalkyl group; d is an integer from 0 to 3 and n is an integer from 1 to about 6. $R^{12}$ is one of the following moieties:

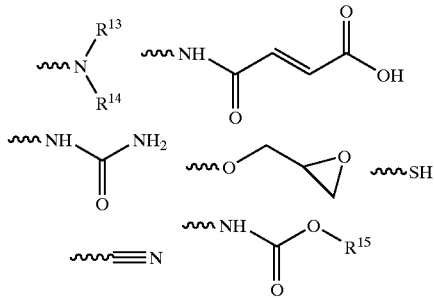

wherein each $R^{13}$ and $R^{14}$ are independently a $C_1$–$C_4$ alkyl group or a $C_5$–$C_7$ cycloalkyl group, and $R^{15}$ is a $C_1$–$C_4$ alkyl group and a $C_5$–$C_7$ cycloalkyl group. Preferred adhesion promoters are those wherein $R^{12}$ are

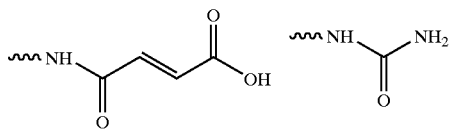

More preferred adhesion promoters are those wherein $R^{12}$ is

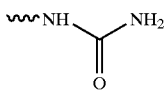

The most preferred adhesion promoters are

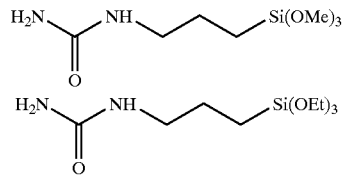

The photosensitive compositions of the present invention may further include other additives. Suitable additives include, for example, leveling agents, dissolution inhibitors and the like. Such additives may be included in the photosensitive compositions in about 0.1–10 wt % of the sum of the weights of photoactive agent and polybenzoxazole precursor polymers I and II.

Furthermore, the present invention concerns a process for forming a relief pattern using the photosensitive composition. The process comprises the steps of:

(a) coating on a suitable substrate, a positive-working photosensitive composition comprising at least one polybenzoxazole precursor polymer having the structure (I), at least one polybenzoxazole precursor polymer having the structure (II), at least one photosensitive agent and at least one solvent, thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

The process may optionally include the step of post exposure baking the exposed coated substrate at an elevated temperature, prior to developing. Still another optional step is rinsing the developed substrate, prior to curing.

The positive acting, photoactive resin of this invention is coated on a suitable substrate. The substrate may be, for example, semiconductor materials such as a silicon wafer or a ceramic substrate, glass, metal, or plastic. Coating methods include, but are not limited to spray coating, spin coating, offset printing, roller coating, screen printing, extrusion coating, meniscus coating, curtain coating, and immersion coating. The resulting film is prebaked at an elevated temperature. The bake may be completed at one or more temperatures within the temperature bake of from about 70° C. to about 120° C. for several minutes to half an hour, depending on the method, to evaporate the remaining solvent. Any suitable baking means may be employed. Examples of suitable baking means include, but are not limited to, hot plates and convection ovens. The resulting dry film has a thickness of from about 3 to about 20 microns or more preferably from about 4 to about 15 microns or most preferably from about 5 to about 10 microns.

After the bake, step, the resulting dry film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, in an optional step it may be advantageous to heat the exposed and coated substrate to a temperature between about 70° C. and 120° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Following exposure to actinic radiation, it is advantageous to heat the exposed and coated substrate to a temperature between about 70° C. and 120° C. The exposed and coated substrate is heated in this temperature range for a short period of time, typically several seconds to several minutes. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddling, or other similar developing methods at temperatures from about 10° C. to 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern.

Formation of polybenzoxazole ring

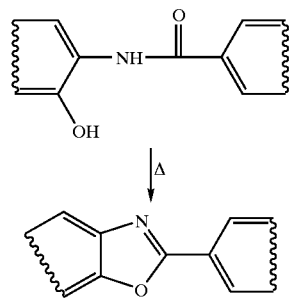

Curing is performed by baking the developed, uncured relief pattern at or above the glass transition temperature $T_g$ of the photosensitive composition to obtain the benzoxazole ring that provides high heat resistance. Typically, temperatures above about 200° C. are used. Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably, under a blanket of nitrogen and may be carried by any suitable heating means. Preferred means include baking on a hot plate or in a convection oven.

In addition, the present invention includes electronic parts obtained by using the invention composition.

To illustrate the present invention, the following examples are provided. It should be understood that the present invention is not limited to the examples described.

SYNTHESIS EXAMPLE 1

Preparation of a Polybenzoxazole Precursor Polymer Having Structure Ia

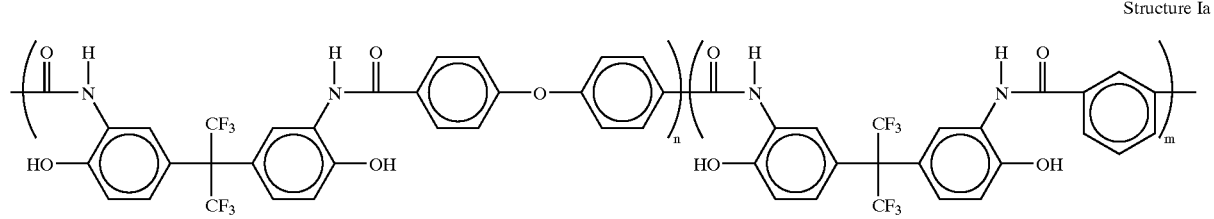

Structure Ia

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0-5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

SYNTHESIS EXAMPLE 2

Preparation of a Polybenzoxazole Precursor Polymer Having Structure IIa

To a 100 mL three-necked round bottom flask equipped with a mechanical stirrer, 5.42 g (10.0 mmol) of the polymer obtained in Synthesis Example 1 and 50 mL of tetrahydrofuran (THF) were added. The mixture was stirred for ten minutes and the solid was fully dissolved. 0.53 g (2 mmol) of 2,1-naphthoquinonediazide-5-sulfonyl chloride was then added and the mixture was stirred for another 10 minutes. Triethylamine, 0.2 g (2 mmol), was added gradually within 15 minutes and then the reaction mixture was stirred for 5 hours. The reaction mixture was then added gradually to 500 mL of vigorously stirred de-ionized water. The precipitated product was separated by filtration and washed with 200 mL of de-ionized water. To the product was added another 600 mL de-ionized water and the mixture vigorously stirred for 30 minutes. After filtration the product was washed with 100 mL de-ionized water. The isolated product was dried at 40° C. overnight. The yield was 91%.

LITHOGRAPHIC EXAMPLE 1

Lithographic Performance of a Photosensitive Composition of the Invention

The following positive acting photosensitive composition was prepared: 1 g of polymer obtained in Synthesis Example 1, 1 g of polymer obtained from Synthesis Example 2, 0.25 g of PAC having structure X were dissolved in 8 g NMP and filtered. In Structure X, $Q^2$ is 20% H and 80% diazoquinone of the structure shown.

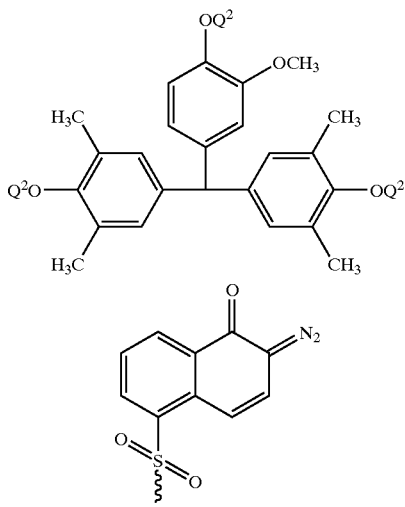

(X)

The formulation was spin coated onto a silicon wafer and the coated wafer were softbaked at 120° C. for 3 minutes to give of film of about 3 μm in thickness. The film was then exposed using a Cannon 4000 I4 i-line stepper and a relief image was obtained by developing the exposed film for 20 seconds using a 0.145N aqueous solution of tetramethylammonium hydroxide (TMAH). The dark or unexposed film thickness retention was 89.7% and Eo, or exposure energy to clear, was 200 mJ/cm². Contrast curve data is generated in Comparative Lithographic Example 2 and charted in the drawing FIGURE.

COMPARATIVE LITHOGRAPHIC EXAMPLE 1

The following positive acting photosensitive composition was prepared: 2 g of polymer obtained in Synthesis Example 2 was dissolved in 8 g NMP and filtered. The formulation was coated into silicon wafers, softbaked at 120° C. for 3 minutes to give a film of 2.6 μm in thickness. The film was exposed with a Cannon 4000 IE i-line stepper and developed for 20 seconds using a 0.145N aqueous TMAH solution. The unexposed film thickness film retention was 97% and the Eo was 470 mJ/cm². Contrast curve data is generated in Comparative Lithographic Example 2 and charted in the drawing FIGURE.

COMPARATIVE LITHOGRAPHIC EXAMPLE 2

The following positive acting photosensitive composition was prepared: 2 g of polymer obtained in Synthesis Example 1 and 0.5 g of PAC having structure X were dissolved in 8 g NMP and filtered.

The formulation was coated onto a silicon wafer and softbaked at 120° C. for 3 minutes to give a 4 μm thick film. The film was exposed with a Cannon 4000 IE i-line stepper and developed for 20 seconds using a 0.145N TMAH aqueous TMAH solution. The unexposed film thickness retention was 85.3% and Eo was 240 mJ/cm².

Contrast curves derived from Example 1, and Comparative Examples 1 and 2 are shown in FIG. 1. The contrast curve for Comparative Example 1 (dots) shows a very high film retention and a sharp increase in dissolution with exposure (high contrast), but a high exposure dose is required to completely develop the photosensitive coating. The contrast curve for Comparative Example 2 (squares) shows lower, but acceptable, unexposed film retention with a more gradual increase in dissolution with exposure energy (low contrast). The contrast curve for Example 1 (triangles) shows both improved unexposed film retention and high contrast over Comparative Example 2. Surprisingly, the exposure required to completely remove the photosensitive composition is also decreased at the same time and is less than either Comparative Examples. This results in better processing latitude. Thus, the photosensitive composition of the invention, has superior lithographic performance compared to comparative examples.

SYNTHESIS EXAMPLE 3

Synthesis of a Polybenzoxazole Polymer Precursor of Structure (Ia) Having an Alternative Monomer Ratio Synthesis Example 1 was repeated except the ratio of chlorides to hexafluoro-2,2-bis(3-amino-4-hydroxyphenyl) propane changed from 1 to 0.903. The yield was quantitative and the inherent viscosity of the polymer was 0.202 dL/g measured in NMP at the concentration of 0.5 g/dL at 25° C.

SYNTHESIS EXAMPLE 4

Synthesis of a Polybenzoxazole Polymer Precursor of Structure (IIa) Having an Alternative Monomer Ratio and Alternative k.

Synthesis Example 2 was repeated except the polymer from Synthesis Example 3 was employed and the ratio of 2,1-naphthoquinonediazide-5-sulfonyl chloride to total number of the OH groups of the polymer was changed to 0.05. The yield was 94% and the inherent viscosity of the polymer was 0.192 dL/g measured in NMP at the concentration of 0.5 g/dL at 25° C.

SYNTHESIS EXAMPLE 5

Synthesis of a Polybenzoxazole Polymer Precursor of Structure (Ia) Having an Alternative Monomer Ratio.

Synthesis Example 1 was repeated except the ratio of chlorides to hexafluoro-2,2-bis(3-amino-4-hydroxyphenyl) propane changed from 1 to 0.87. The yield was quantitative and the inherent viscosity of the polymer was 0.185 dL/g measured in NMP at the concentration of 0.5 g/dL at 25° C.

SYNTHESIS EXAMPLE 6

Synthesis of a Polybenzoxazole Polymer Precursor of Structure (IIa) Having an Alternative Monomer Ratio and Alternative k.

Synthesis Example 2 was repeated except the polymer from Synthesis Example 5 was employed and the ratio of 2,1-naphthoquinonediazide-5-sulfonyl chloride to the total number of OH groups of the polymer was changed to 0.035. The yield was 93% and the inherent viscosity of the polymer was 0.172 dL/g measured in NMP at the concentration of 0.5 g/dL at 25° C.

SYNTHESIS EXAMPLE 7

Synthesis of a Polybenzoxazole Polymer Precursor of Structure Ib

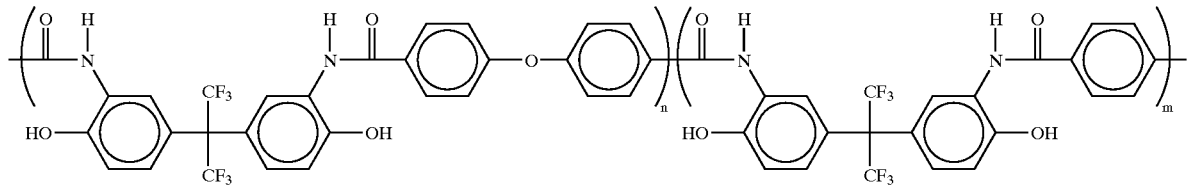

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 7250 g of N-methyl-2-pyrrolidone (NMP) were added. The solution was stirred at room temperature until all solids dissolved and then cooled in an ice water bath at 0–5° C. To this solution, 291 g g (1.43 mol) of terephthaloyl chloride and 634.5 g (2.15 mol) of 1,4-oxydibenzoyl chloride dissolved in 2760 g of NMP was added by using a diaphragm pump and Teflon transfer lines. The pump and Teflon transfer lines were cleaned by using 200 g of NMP. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.183 dL/g measured in NMP at the concentration of 0.5 g/dL at 25° C.

SYNTHESIS EXAMPLE 8

Synthesis of a Polybenzoxazole Polymer Precursor of Structure IIb

Synthesis Example 2 was repeated except the polymer from Synthesis Example 7 was employed and the ratio of 2,1-naphthoquinonediazide-5-sulfonyl chloride to the total number of OH groups of the polymer was changed to 0.02. The yield was 96% and the inherent viscosity of the polymer was 0.201 dL/g measured in NMP at the concentration of 0.5 g/dL at 25° C.

SYNTHESIS EXAMPLE 9

Synthesis of a Polybenzoxazole Polymer Precursor of Structure Ic

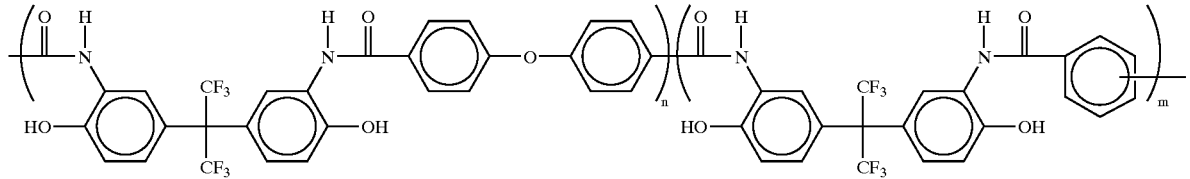

To a 20 L reactor equipped with a mechanical agitator, nitrogen inlet and thermocouple, 1500 g (4.09 mol) of hexafluoro-2,2-bis(3-amino-4-hydroxyphenyl)propane, 622 g (7.86 mol) of pyridine and 5000 g of N-methyl-2-pyrrolidone (NMP) were added. The solution was stirred at room temperature until all solids dissolved and then cooled in an ice water bath at 0-5° C. To this solution, 212.0 g g (1.04 mol) of terephthaloyl chloride, 212.0 g g (1.04 mol) of isophthaloyl chloride and 411.0 g (1.39 mol) of 1,4-oxydibenzoyl chloride dissolved in 2960 g of NMP was added by using a diaphragm pump and Teflon transfer lines. The pump and Teflon transfer lines were cleaned by using 200 g of NMP. After the addition was completed, the resulting mixture was stirred at room temperature for 18 hours. The viscous solution was precipitated in 140 L of vigorously stirred de-ionized water. The polymer was collected by filtration and washed with 35 L of de-ionized water and a water/methanol (50/50) mixture. The polymer was dried under vacuum at 75° C. for 24 hours. The yield was almost quantitative and the inherent viscosity of the polymer was 0.205 dL/g measured in NMP at the concentration of 0.5 g/dL at 25° C.

SYNTHESIS EXAMPLE 10

Synthesis of a Polybenzoxazole Polymer Precursor of Structure IIc

Synthesis Example 2 was repeated except the polymer from Synthesis Example 9 was employed and the ratio of 2,1-naphthoquinonediazide-5-sulfonyl chloride to the total number of OH groups of the polymer was changed to 0.025. The yield was 96% and the inherent viscosity of the polymer was 0.201. dL/g measured in NMP at the concentration of 0.5 g/dL at 25° C.

General Lithographic Procedure 1

The photosensitive polybenzoxazole precursor formulation was spin coated on a silicon wafer and baked on a hotplate for 4 minutes at 120° C. The resulting film thickness was measured on a profilometer. The film was then exposed utilizing a Cannon 4000 I4 i-line stepper. Portions of the wafer were individually exposed to create an array in which adjacent rectangular frames received an incrementally increased (10 mJ/cm$^2$) exposure energy with a starting exposure energy specified in the example. The wafers were then developed using OPD 4262, a 0.262N aqueous tetramethyl ammonium hydroxide developer from Arch Chemicals. The wafers were developed by streaming developer onto the wafer surface and developing for a time specified in the examples. The developer was spun off the film for a few seconds, and then fresh developer was streamed onto the wafer. The film was then further developed for the same time increment and then the developer spun off. The wafer was then rinsed with DI H$_2$O for 12 seconds while spinning at 1000 rpm, followed by a 10 second, 3500 rpm drying step. The development produced an array of exposed frames that were either clear of or containing residual photosensitive formulation. These frames were visually inspected for the lowest exposure energy at which the array frames were completely cleared. The film thickness was then re-measured to calculate film thickness loss during development.

LITHOGRAPHIC EXAMPLE 2

85 parts of polymer obtained in Synthesis Example 3, 15 parts of polymer obtained in Synthesis Example 4, 11.6 parts of Bisphenol AP PAC (Structure XI shown below), 2.45 parts of diphenolsilanediol and 2.9 parts of gamma-ureidopropyltrimethoxysilane were dissolved in GBL and filtered.

The formulation lithographically tested according to General Lithographic Procedure 1. The spin speed employed was 1170 revolutions per minute. The thickness obtained was 13.89 μm. The starting exposure energy was 600 mJ/cm$^2$. The development time for each puddle cycle was 26 seconds. The formulation cleared frames at a dose of 630 mJ/cm$^2$. The unexposed film thickness decreased 5.81 microns to 8.08 microns (41.83% Film thickness loss).

The formulation lithographically tested according to General Lithographic Procedure 1. The spin speed employed was 1120 revolutions per minute. The thickness obtained was 14.03 μm. The starting exposure energy was 800 mJ/cm$^2$. The development time for each puddle cycle was 45 seconds. The formulation cleared frames at a dose of 900 mJ/cm$^2$. The unexposed film thickness decreased 4.47 microns to 9.56 microns (31.86% Film thickness loss).

LITHOGRAPHIC EXAMPLE 5

35 parts of polymer obtained in Synthesis Example 3, 65 parts of polymer obtained in Synthesis Example 4, 11.6 parts of Bisphenol AP PAC, 2.45 parts of diphenylsilanediol and 2.9 parts of gamma-Ureidopropyltrimethoxysilane were dissolved in GBL and filtered.

The formulation lithographically tested according to General Lithographic Procedure 1. The spin speed employed was 1120 revolutions per minute. The thickness obtained was 13.95 μm. The starting exposure energy was 600 mJ/cm$^2$. The development time for each puddle cycle was 60 seconds. The formulation cleared frames at a dose of 690 mJ/cm$^2$. The unexposed film thickness decreased 5.83 microns to 8.12 microns (41.79% Film thickness loss).

LITHOGRAPHIC EXAMPLE 6

7.15 parts of polymer obtained in Synthesis Example 5, 92.85 parts of polymer obtained in Synthesis Example 6, 11.6 parts of Bisphenol AP PAC, 2.45 parts of diphenylsilanediol and 2.9 part of gamma-Ureidopropyltrimethoxysilane were dissolved in GBL and filtered.

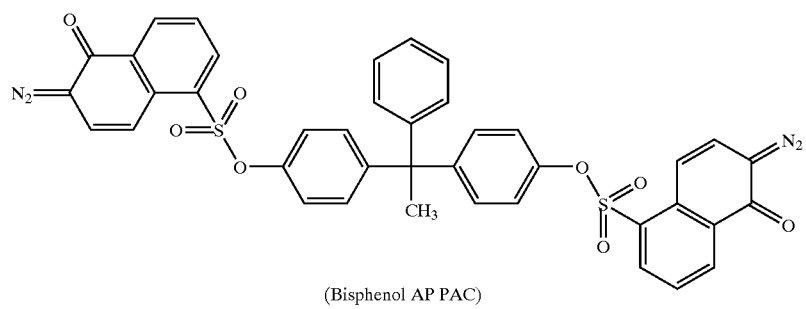

(Bisphenol AP PAC)

LITHOGRAPHIC EXAMPLE 3

70 parts of polymer obtained in Synthesis Example 3, 30 parts of polymer obtained in Synthesis Example 4, 11.6 parts of Bisphenol AP PAC, 2.45 parts of diphenysilanediol and 2.9 parts of gamma-Ureidopropyltrimethoxysilane were dissolved in GBL and filtered.

The formulation lithographically tested according to General Lithographic Procedure 1. The spin speed employed was 1160 revolutions per minute. The thickness obtained was 13.88 μm. The starting exposure energy was 600 mJ/cm$^2$. The development time for each puddle cycle was 30 seconds. The formulation cleared frames at a dose of 690 mJ/cm$^2$. The unexposed film thickness decreased 5.41 microns to 8.47 microns (38.98% Film thickness loss).

LITHOGRAPHIC EXAMPLE 4

35 parts of polymer obtained in Synthesis Example 3, 65 parts of polymer obtained in Synthesis Example 4, 11.6 parts of Bisphenol PAC, 2.45 parts of diphenylsilanediol and 2.9 parts of gamma-ureidopropyltrimethoxysilane were dissolved in GBL and filtered.

The formulation lithographically tested according to General Lithographic Procedure 1. The spin speed employed was 960 revolutions per minute. The thickness obtained was 14.13 μm. The starting exposure energy was 800 mJ/cm$^2$. The development time for each puddle cycle was 20 seconds. The formulation cleared frames at a dose of 860 mJ/cm$^2$. The unexposed film thickness decreased 5.03 microns to 9.10 microns (35.60% Film thickness loss).

LITHOGRAPHIC EXAMPLE 7

25 parts of polymer obtained in Synthesis Example 7, 75 parts of polymer obtained in Synthesis Example 8, 15 parts of PAC shown in Structure X, and 2.0 parts of gamma-glycidoxypropyltrimethoxysilane were dissolved in NMP and filtered.

The formulation lithographically tested according to General Lithographic Procedure 1 except that the exposure increment was 50 mJ/cm$^2$. The spin speed employed was 1390 revolutions per minute. The thickness obtained was 13.95 μm. The starting exposure energy was 100 mJ/cm$^2$.

The development time for each puddle cycle was 20 seconds. The formulation cleared frames at a dose of 300 mJ/cm². The unexposed film thickness decreased to 4.43 microns.

LITHOGRAPHIC EXAMPLE 8

12.5 parts of polymer obtained in Synthesis Example 9, 87.5 parts of polymer obtained in Synthesis Example 10, 31.5 part of PAC shown in Structure X, 5.0 parts of gamma-mercaptopropyltrimethoxysilane and 5 parts of diphenylsilanediol were dissolved in NMP and filtered.

The formulation lithographically tested according to General Lithographic Procedure 1. The spin speed employed was 1390 revolutions per minute. The thickness obtained was 21.46 μm. The starting exposure energy was 1000 mJ/cm². The development time for each puddle cycle was 70 seconds. The formulation cleared frames at a dose of 2600 mJ/cm². The unexposed film thickness decreased to 11.19 microns.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A positive photosensitive resin composition comprising:

(a) at least one polybenzoxazole precursor polymer having the Structure (I);

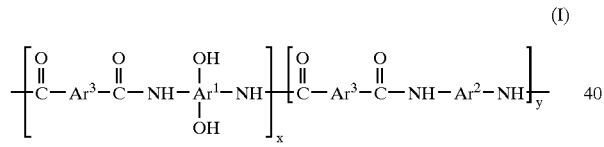

wherein $Ar^1$ is selected from the group consisting of a tetravalent aromatic group, a tetravalent heterocyclic group, and mixtures thereof; $Ar^2$ is selected from the group consisting of a divalent aromatic, a divalent heterocyclic, a divalent alicyclic, or a divalent aliphatic group that may contain silicon, and mixtures thereof; $Ar^3$ is is selected from the group consisting of a divalent aromatic group, a divalent aliphatic group, a divalent heterocyclic group, and mixtures thereof; x is from about 10 to about 1000; y is 0 to about 900;

(b) at least one polybenzoxazole precursor polymer having the structure (II)

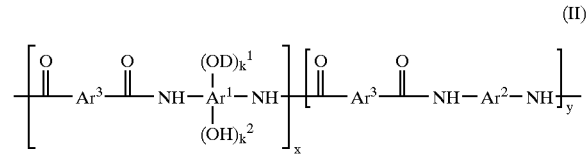

wherein $Ar^1$, $Ar^2$, $Ar^3$, x and y are as previously defined; D is selected from the group consisting of one of the following moieties:

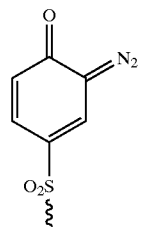

IIIa

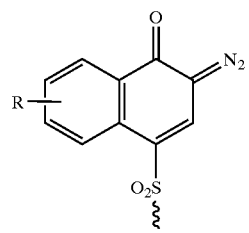

IIIb

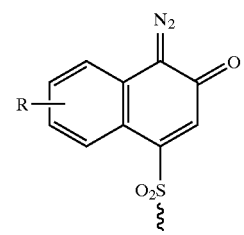

IIIc

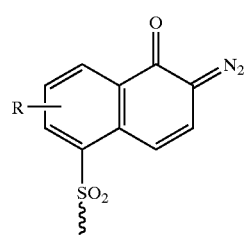

IIId

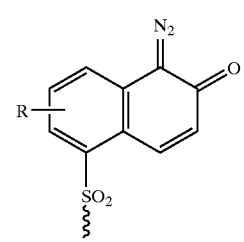

IIIe wherein R is selected from the group consisting of H, a halogen, a $C_1$–$C_4$ alkyl group, a $C_1$–$C_4$ alkoxy group, and a $C_5$–$C_7$ cycloalkyl group; $k^1$ can be any positive value of up to about 0.5, $k^2$ can be any value from about 1.5 to 2 with the proviso that $(k^1+k^2)=2$, (c) at least one photosensitive agent; and (d) at least one solvent.

2. A positive photosensitive resin composition according to claim 1, wherein the ratio of the mount of precursor polymer (I) to precursor polymer (II) is from about 20:80 to about 80:20.

3. A positive photosensitive resin composition according to claim 2, wherein the ratio of the mount of precursor polymer (I) to precursor polymer (II) is from about 35:65 to about 65:35.

4. A positive photosensitive resin composition according to claim 1, wherein in precursor polymers (I) and (II) x+y is less than about 1000.

5. A positive photosensitive resin composition according to claim 4, wherein x is from about 10 to about 300 and y is from about 0 to 250.

6. A positive photosensitive resin composition according to claim 5, wherein x is from about 10 to about 50 and y is from about 0 to 5.

7. A positive photosensitive resin composition according to claim 1, wherein $k^1$ is from about 0.01 to about 0.4.

8. A positive photosensitive resin composition according to claim 7, wherein $k^1$ from about 0.01 to about 0.05.

9. A positive photosensitive resin composition according to claim 1, wherein the composition additionally comprises an adhesion promoter.

10. A positive photosensitive resin composition according to claim 9, wherein the composition additionally comprises an adhesion promoter that comprises an amino silane.

11. A positive photosensitive resin composition according to claim 9, wherein the composition additionally comprises an adhesion promoter of the formula:

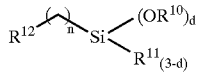

wherein each $R^{10}$ is independently selected from the group consisting of a $C_1$–$C_4$ alkyl group and a $C_5$–$C_7$ cycloalkyl group; and each $R^{11}$ is independently selected from the group consisting of a $C_1$–$C_4$ alkyl group, a $C_1$–$C_4$ alkoxy group and a $C_5$–$C_7$ cycloalkyl group; d is an integer from 0 to 3 and n is an integer from 1 to about 6, and $R^{12}$ is selected from the group consisting of the moieties:

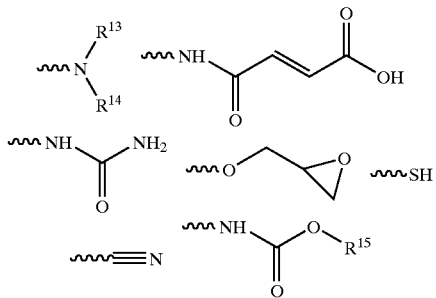

wherein each $R^{13}$ and $R^{14}$ are independently selected from the group consisting of a $C_1$–$C_4$ alkyl group and a $C_5$–$C_7$ cycloalkyl group; and $R^{15}$ is selected from the group consisting of a $C_1$–$C_4$ alkyl group and a $C_5$–$C_7$ cycloalkyl group.

12. A positive photosensitive resin composition according to claim 11, wherein $R^{12}$ is a moiety selected from the group consisting of

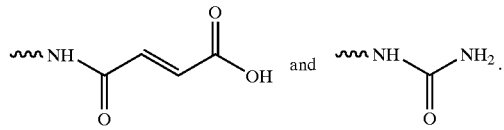

13. A positive photosensitive resin composition according to claim 11, wherein the adhesion promoter is selected from the group consisting of

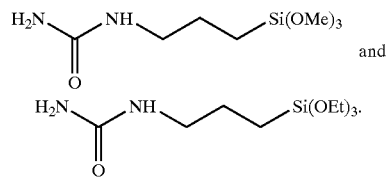

14. A positive photosensitive resin composition according to claim 1, wherein $Ar^1$ is a moiety selected from the group consisting of

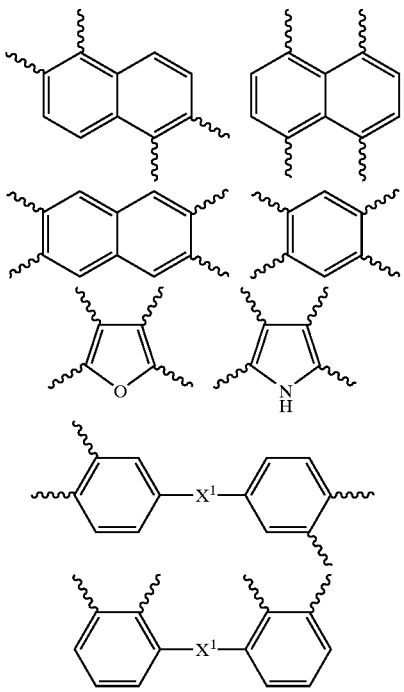

wherein $X^1$ is selected from the group consisting of —O—, —S—, —C(CF$_3$)$_2$—, —CH$_2$—, —SO$_2$—, —NHCO— and —SiR$^1$$_2$— and each $R^1$ is independently selected from the group consisting of $C_1$–$C_7$ linear or branched alkyl and $C_5$–$C_8$ cycloalkyl groups.

15. A positive photosensitive resin composition according to claim 1, wherein $Ar^3$ is a moiety selected from the group consisting of

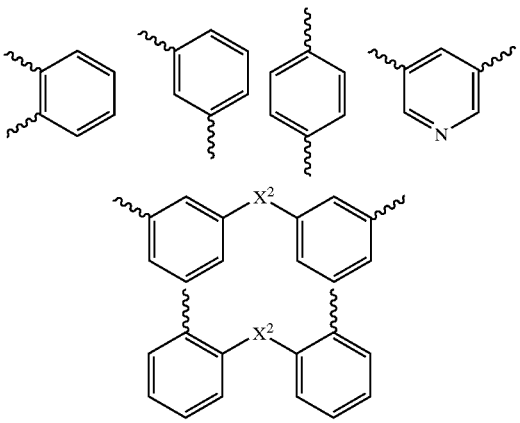

-continued

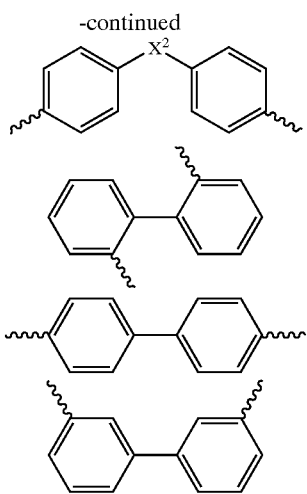

wherein $X^2$ is —O—, —S—, —C(CF$_3$)$_2$—, —CH$_2$—, —SO$_2$—, or —NHCO—.

16. A positive photosensitive resin composition according to claim 1, wherein Ar$^1$ is a moiety derived from a reactant selected from the group consisting of 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane, and Ar$^3$ is a moiety derived from a reactant selected from the group consisting of 4,4'-diphenyletherdicarboxylic acid, terephthalic acid, isophthalic acid, isophthaloyl dichloride, phthaloyl dichloride, terephthaloyl dichloride, 4,4'-diphenyletherdicarboxylic acid dichloride, dimethylisophthalate, dimethylphthalate, dimethylterphthalate, diethylisophthalate, diethylphthalate, diethylterphthalate and mixtures thereof.

17. A positive photosensitive resin composition according to claim 16, wherein D is selected from the group consisting of structures IIIb and IIId where R is selected from the group consisting of halogen, a halogen, a C$_1$–C$_4$ alkyl group, a C$_1$–C$_4$ alkoxy group and a C$_5$–C$_7$ cycloalkyl group.

18. A positive photosensitive resin composition according to claim 1, wherein the at least one photosensitive agent is selected from the group consisting of VII-a
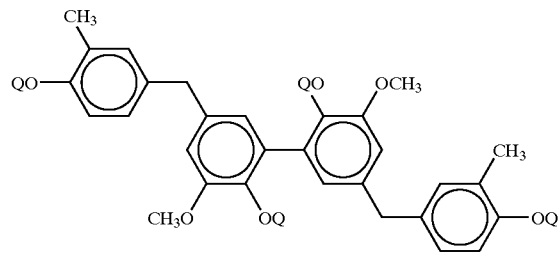

VII-b
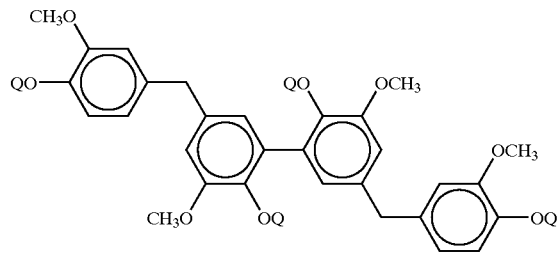

VII-c
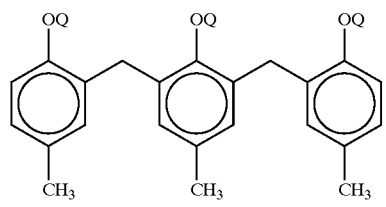

VII-d
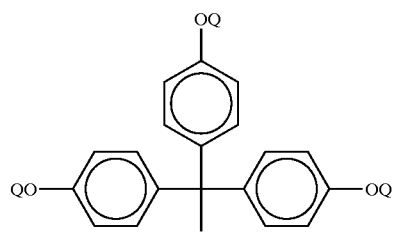

VII-e
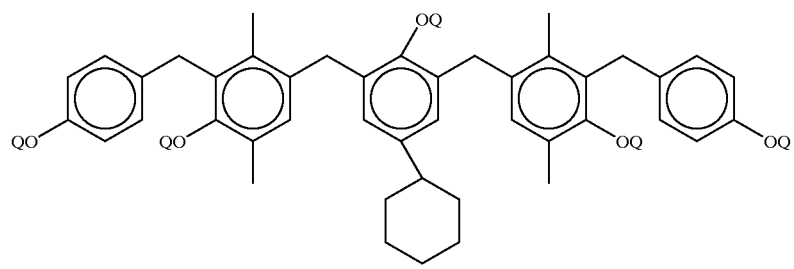

-continued
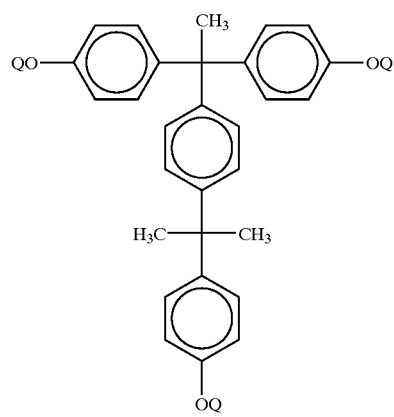 VII-f
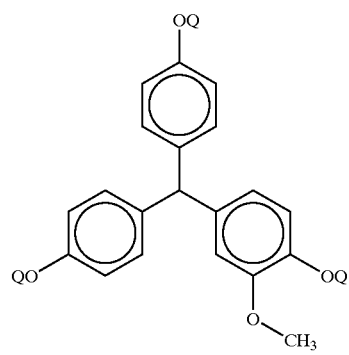 VII-g
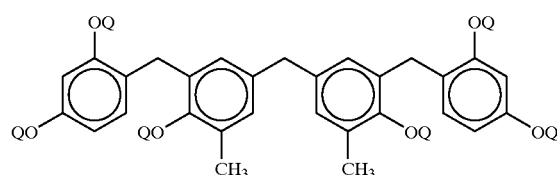 VII-h
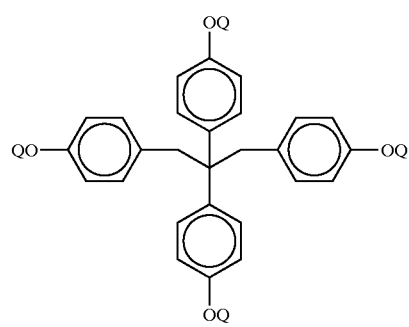 VII-i
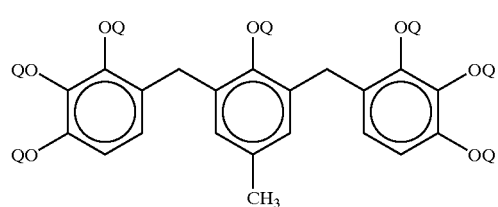 VII-j
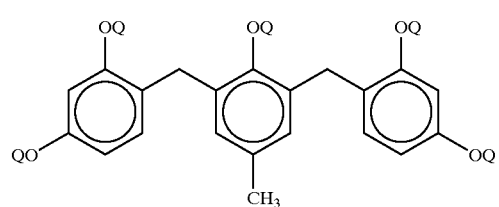 VII-k
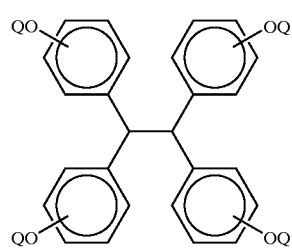 VII-l
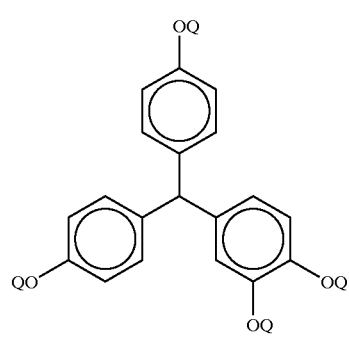 VII-m

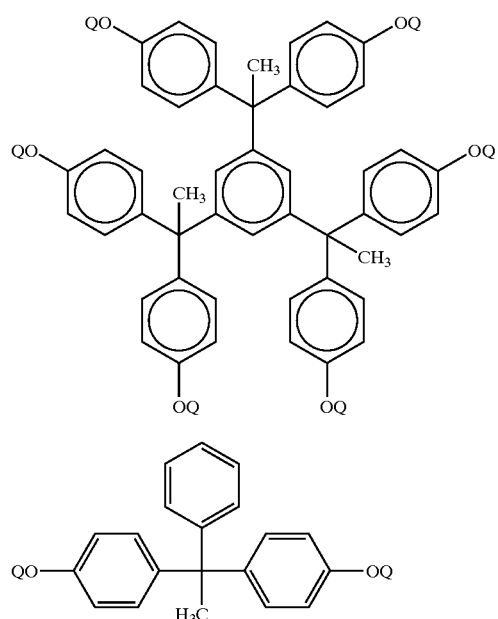
VII-n

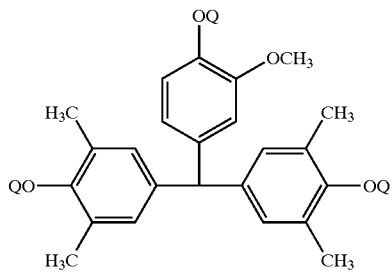
VII-o

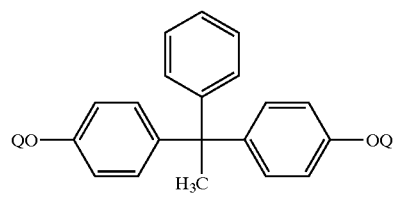

VII-p wherein Q is H or D with the proviso that in each compound at least one Q is not H, and D is selected from the group consisting of one of the following moieties:

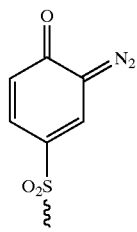
IIIa

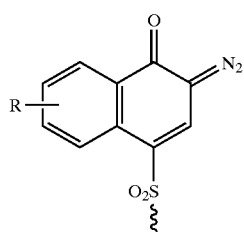
IIIb

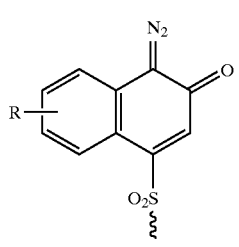
IIIc

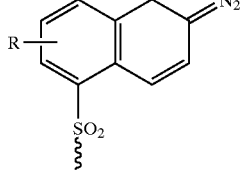
IIId

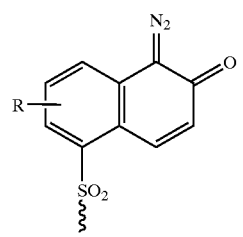
IIIe wherein R is selected from the group consisting of H, a halogen, a $C_1$–$C_4$ alkyl group, a $C_1$–$C_4$ alkoxy group, and a $C_5$–$C_7$ cycloalkyl group.

19. A process for forming a relief pattern on a substrate, the process comprising the steps of:

(a) coating on a suitable substrate, a positive-working photosensitive composition of claim 1 thereby forming a coated substrate;

(b) prebaking the coated substrate;

(c) exposing the prebaked coated substrate to actinic radiation;

(d) developing the exposed coated substrate with an aqueous developer, thereby forming an uncured relief image on the coated substrate; and (e) baking the developed coated substrate at an elevated temperature, thereby curing the relief image.

20. A process for forming a relief pattern on a substrate, the process comprising the steps of:
 (a) coating on a suitable substrate, a positive-working photosensitive composition of claim 2 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

21. A process for forming a relief pattern on a substrate, the process comprising the steps of:
 (a) coating on a suitable substrate, a positive-working photosensitive composition of claim 3 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

22. A process for forming a relief pattern on a substrate, the process comprising the steps of:
 (a) coating on a suitable substrate, a positive-working photosensitive composition of claim 4 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

23. A process for forming a relief pattern on a substrate, the process comprising the steps of:
 (a) coating on a suitable substrate, a positive-working photosensitive composition of claim 5 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

24. A process for forming a relief pattern on a substrate, the process comprising the steps of:
 (a) coating on a suitable substrate, a positive-working photosensitive composition of claim 6 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and (e) baking the developed coated substrate at an elevated temperature, thereby curing the relief image.

25. A process for forming a relief pattern on a substrate, the process comprising the steps of:
 (a) coating on a suitable substrate, a positive-working photosensitive composition of claim 7 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

26. A process for forming a relief pattern on a substrate, the process comprising the steps of:
 (a) coating on a suitable substrate, a positive-working photosensitive composition of claim 8 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

27. A process for forming a relief pattern on a substrate, the process comprising the steps of:
 (a) coating on a suitable substrate, a positive-working photosensitive composition of claim 9 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

28. A process for forming a relief pattern on a substrate, the process comprising the steps of:
 (a) coating on a suitable substrate, a positive-working photosensitive composition of claim 10 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and
 (e) baking the developed coated substrate at an elevated temperature, thereby curing the relief image.

29. A process for forming a relief pattern on a substrate, the process comprising the steps of:
 (a) coating on a suitable substrate, a positive-working photosensitive composition of claim 11 thereby forming a coated substrate;
 (b) prebaking the coated substrate;
 (c) exposing the prebaked coated substrate to actinic radiation;
 (d) developing the exposed coated substrate with an aqueous developer, thereby forming an uncured relief image on the coated substrate; and (e) baking the developed coated substrate at an elevated temperature, thereby curing the relief image.

30. A process for forming a relief pattern on a substrate, the process comprising the steps of:
   (a) coating on a suitable substrate, a positive-working photosensitive composition of claim 12 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

31. A process for forming a relief pattern on a substrate, the process comprising the steps of:
   (a) coating on a suitable substrate, a positive-working photosensitive composition of claim 13 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

32. A process for forming a relief pattern on a substrate, the process comprising the steps of:
   (a) coating on a suitable substrate, a positive-working photosensitive composition of claim 14 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

33. A process for forming a relief pattern on a substrate, the process comprising the steps of:
   (a) coating on a suitable substrate, a positive-working photosensitive composition of claim 15 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

34. A process for forming a relief pattern on a substrate, the process comprising the steps of:
   (a) coating on a suitable substrate, a positive-working photosensitive composition of claim 16 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

35. A process for forming a relief pattern on a substrate, the process comprising the steps of:
   (a) coating on a suitable substrate, a positive-working photosensitive composition of claim 17 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

36. A process for forming a relief pattern on a substrate, the process comprising the steps of:
   (a) coating on a suitable substrate, a positive-working photosensitive composition of claim 18 thereby forming a coated substrate;
   (b) prebaking the coated substrate;
   (c) exposing the prebaked coated substrate to actinic radiation;
   (d) developing the exposed coated substrate with an aqueous developer, thereby forming an uncured relief image on the coated substrate; and
   (e) baking the developed coated substrate at an elevated temperature, thereby curing the relief image.

37. A substrate having a patterned image produced by the process of claim 19.

38. A substrate having a patterned image produced by the process of claim 29.

39. A substrate having a patterned image produced by the process of claim 35.

40. A substrate having a patterned image produced by the process of claim 36.

* * * * *